United States Patent
Kerr et al.

(10) Patent No.: US 6,811,641 B2
(45) Date of Patent: Nov. 2, 2004

(54) LAMINATION METHOD TO CREATE A PRE-PRESS PROOF WITH A THERMAL MARK

(75) Inventors: Roger S. Kerr, Brockport, NY (US); Larry R. Gartz, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 210 days.

(21) Appl. No.: 10/020,772

(22) Filed: Dec. 12, 2001

(65) Prior Publication Data

US 2003/0107212 A1 Jun. 12, 2003

(51) Int. Cl.[7] .............................................. B32B 31/20
(52) U.S. Cl. ........................ 156/209; 156/219; 156/240; 156/583.5; 430/358; 430/293
(58) Field of Search ............................ 156/209, 219, 156/240, 580, 581, 582, 583.1, 583.5; 283/74; 428/195.1; 430/358, 293, 295, 252–254

(56) References Cited

U.S. PATENT DOCUMENTS

| | | | |
|---|---|---|---|
| 5,203,942 A | | 4/1993 | DeCook et al. |
| 5,268,708 A | | 12/1993 | Harshbarger et al. |
| 5,327,825 A | * | 7/1994 | Parker et al. .................. 101/32 |
| 5,359,387 A | * | 10/1994 | Hicks ........................... 355/40 |
| 5,429,696 A | * | 7/1995 | Rohleder et al. ............ 156/220 |
| 5,451,560 A | * | 9/1995 | Akada et al. ................ 503/227 |
| 5,478,434 A | | 12/1995 | Kerr et al. |
| 6,177,234 B1 | * | 1/2001 | Metzger ...................... 430/291 |

FOREIGN PATENT DOCUMENTS

EP  0949081  * 10/1999  ............ B41J/2/205

OTHER PUBLICATIONS

US 2003/0020945, Lopez et al., published Jan. 30, 2003, filed Jul. 27, 2001.*
Kerr, "Laminator Assembly Having a Pressure Roller with a Deformable Layer", USSN 09/676,877, filed Sep. 29, 2000.

* cited by examiner

*Primary Examiner*—Jeff H. Aftergut
*Assistant Examiner*—Jessica Rossi
(74) *Attorney, Agent, or Firm*—Buskop Law Group, P.C.

(57) ABSTRACT

A method, a laminator (10), and a belt, for creating a pre-press proof (200) with a thermal mark (190) which comprises laminating a pre-laminate sheet (240) consisting of a first thermoplastic layer, and a first support layer (150) to a receiver stock (160); removing the first support layer (150) forming a pre-laminated receiver stock (350); creating an imaged receiver sheet (140) with a second print layer (308) and a second support layer (170); laminating the imaged receiver sheet (140) with the pre-laminated receiver stock (350) using an embossing belt (110) with an embossing mark 115; and removing the second support layer (170) creating a pre-press proof with a thermal mark (230).

6 Claims, 8 Drawing Sheets

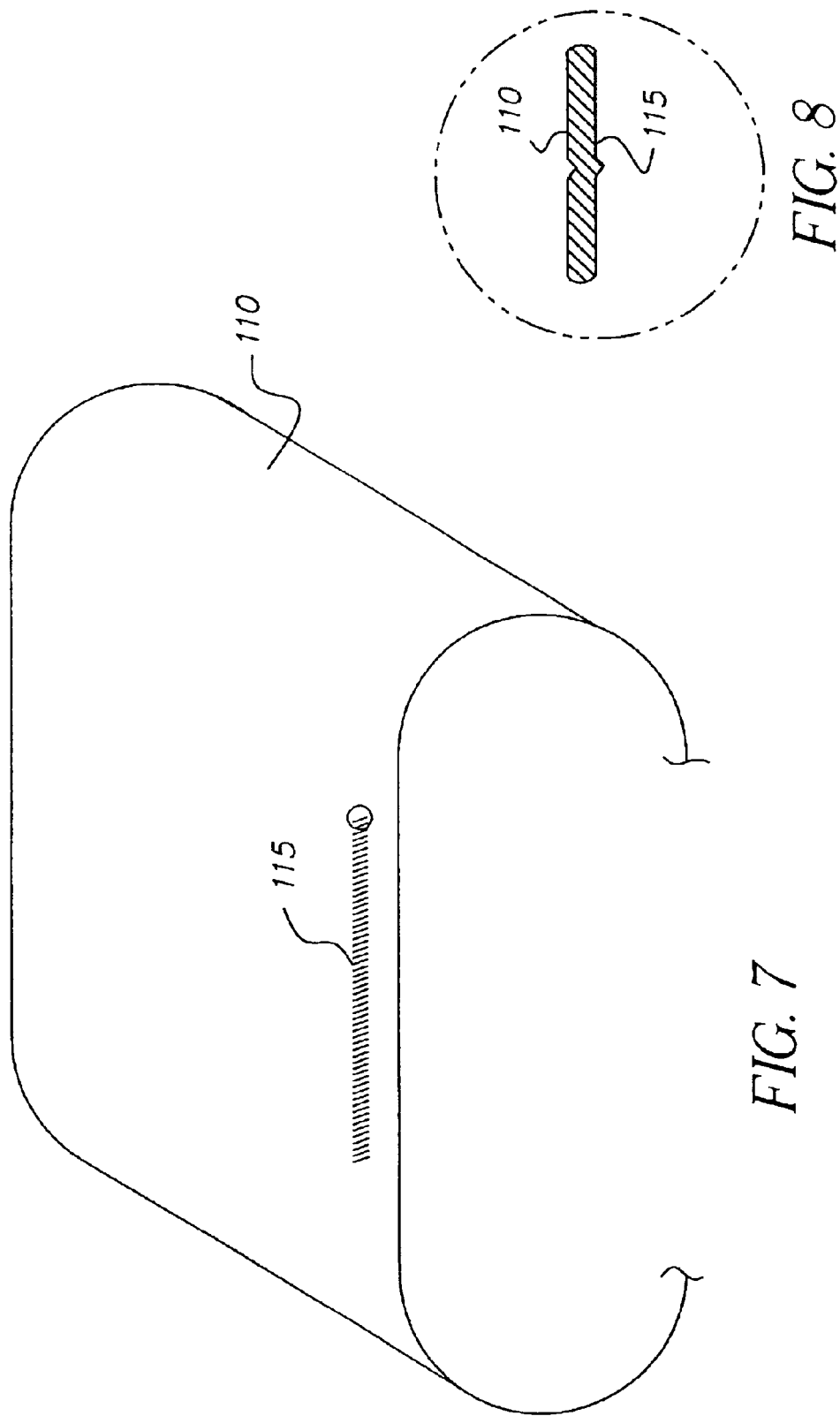

LAMINATION METHOD TO CREATE A PRE-PRESS PROOF WITH A THERMAL MARK

FIELD OF THE INVENTION

The present invention relates to the art of color proofing, and in particular, to a method of preparing a pre-press proof with a thermal mark, such as by the use of pressure and heat to laminate media together.

BACKGROUND OF THE INVENTION

Pre-press proofing is a procedure that is used primarily by the printing industry for creating representative images of printed material. In the printing industry pre-press proofs are used to check for color balance, control parameters, and other important image quality requirements, without the cost and time that is required to actually produce printing plates, set up a printing press, and produce an example of a representative image, which would result in higher costs and a loss of profits that would ultimately be passed on to the customer.

To create a pre-press proof first an original image is separated into individual color separations or digital files. The original image is scanned and separated into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. Third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly-assigned U.S. Pat. No. 5,268,708, which describes an image processing apparatus having half-tone imaging capabilities. The above-mentioned image processing apparatus is arranged to form a representative image onto a sheet of print media in which colorant from a sheet of colorant donor material is transferred to the print media, by applying a sufficient amount of thermal energy to the colorant donor sheet material to form the representative image. The image processing apparatus is comprised generally of a material supply assembly and a lathe bed scanning subsystem. The scanning subsystem includes a lathe bed scanning frame, translation drive, translation stage member, printhead, imaging drum, and media exit transports.

The operation of the image processing apparatus comprises metering a length of the print media (in roll form) from the material supply assembly. The print media is then measured and cut into sheet form of the required length and transported to the imaging drum, registered, wrapped around, and secured onto the imaging drum. Next, a length of colorant donor material (in roll form) is also metered out of the material supply assembly, then measured and cut into sheet form of the required length, transported to the imaging drum, and wrapped around the imaging drum utilizing a load roller which is described in detail, in commonly-assigned U.S. Pat. No. 5,268,708, such that it is superposed in the desired registration with respect to the print media, which has already been secured to the imaging drum.

After the colorant donor sheet material is secured to the periphery of the imaging drum the scanning subsystem or write engine provides the imaging function. This image function is accomplished by retaining the print media and the colorant donor sheet material on the imaging drum while it is rotated past the printhead. The translation drive traverses the printhead and translation stage member axially along the axis of the imaging drum, in coordinated motion with the rotating imaging drum. These movements combine to produce the representative image on the print media.

Once the representative image has been formed on the print media, the colorant donor sheet material is then removed from the imaging drum. This is accomplished without disturbing the print media that is beneath it. The colorant donor sheet material is then transported out of the image processing apparatus by means of the material exit transport. Additional colorant donor sheet materials featuring other desired colorants are sequentially superimposed with the print media on the imaging drum and then imaged onto the print media as previously mentioned, until the representative image is completed on the print media. The representative image formed thereon is then unloaded from the imaging drum and transported by the receiver sheet material exit transport to an exit tray in the exterior of the image processing apparatus.

After a representative image has been formed on the print media as previously described it is transferred to a receiver stock such that the pre-press proof is representative of the intended image to be printed on a printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and copending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a print layer, is placed on top of a sheet or receiver stock. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

Although the above described lamination method works well for most materials and both laser thermal and inkjet pre-press proofs there exists a need for laminating a wider variety of pre-press proofs such as a pre-press proof with a thermal mark to appear to have a hologram or foil effect used in the graphics packaging market.

SUMMARY OF THE INVENTION

The present invention relates to a method for forming a pre-press proof with a thermal mark, a laminator for performing the steps necessary to create thermal marks on a pre-press proof, and a belt laminator with embossing belt to be used to perform the embossing to create a pre-press proof with a thermal mark.

Specifically the method for creating a pre-press proof with a thermal mark comprises the steps of creating a pre-press proof having an image formed thereon; embossing the surface of the pre-press proof by laminating the pre-press proof with an embossing belt having a thermal mark thereon; and forming a pre-press proof with a thermal mark.

In an alternative embodiment, the invention relates to a method for creating a pre-press proof with a thermal mark which comprises the steps of creating a pre-press proof having an image formed thereon; overlaying and laminating the pre-press proof with a plastic cover sheet forming an over laid pre-press proof; embossing the surface of the overlaid pre-press proof by laminating the overlaid pre-press proof with an embossing belt having an image to form a thermal mark thereon; and forming a pre-press proof with a thermal mark.

In another alternative embodiment, the invention relates to a method for creating a pre-press proof with a thermal mark which comprises creating an imaged receiver sheet having a support layer and a print layer having an image formed on the print layer; laminating the imaged receiver sheet to a sheet of receiver stock; removing the support layer creating a pre-press proof; overlaying and laminating the pre-press proof with a glossing sheet; removing the glossing sheet forming a glossy pre-press proof; embossing the surface of the glossy pre-press proof by laminating the glossy pre-press proof with an embossing belt having an image to form a thermal mark thereon; and forming a pre-press proof with a thermal mark.

In another alternative embodiment, the invention relates to a method for creating a pre-press proof with a thermal mark which comprises laminating a pre-laminate sheet consisting of a first print layer and a first support layer to a receiver stock; removing the first support layer forming a pre-laminated receiver stock; creating an imaged receiver sheet with a second support layer and a second print layer having an image formed on the second print layer; laminating the imaged receiver sheet to the pre-laminated receiver stock; removing the second support layer creating a pre-laminated pre-press proof; overlaying and laminating a glossing sheet to the pre-laminated pre-press proof; removing the glossing sheet forming a pre-laminated glossy pre-press proof; embossing the surface of the pre-laminated glossed pre-press proof by laminating using an embossing belt having an image to form a thermal mark thereon with the pre-laminated glossy pre-press proof; and forming a pre-press proof with a thermal mark.

A laminator for forming a pre-press proof with a thermal mark; having an identifying mark comprising; a first roller located on a first side of a media passage; a second roller located on a second side of the media passage so as to oppose the first roller, wherein a nip portion is defined between the first and second rollers so as to apply pressure to media in the media passage which passes through the nip portion; and wherein at least one of the first and second rollers is a solid roller; and at least one embossing belt; and wherein the embossing belt forms a thermal mark on a pre press proof upon passing of the pre-press proof through the laminator.

BRIEF DESCRIPTION OF THE DRAWINGS

FIG. 7 is a perspective view of the belt according to the present invention.

FIG. 8 is a fragmentary cross-section view of the embossing belt shown in FIG. 7 and showing an embossing mark formed on the belt.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proofs.

Figure 1:
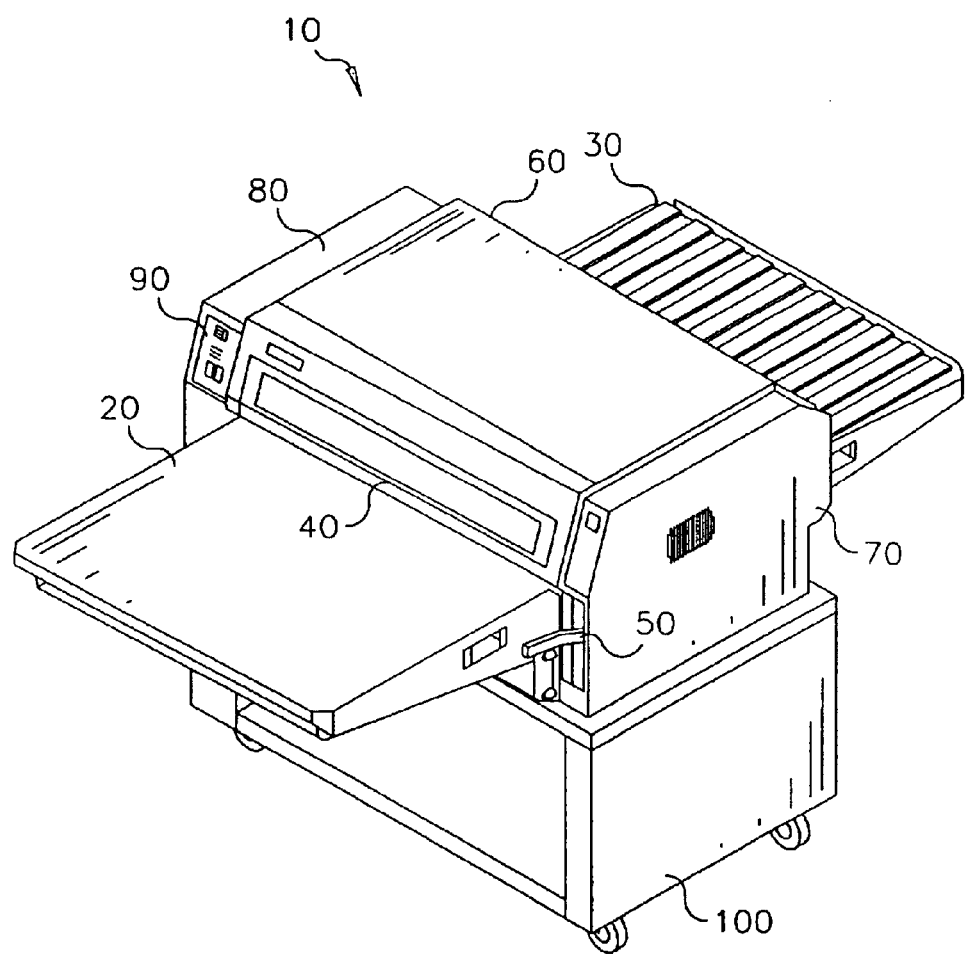
FIG. 1 is a perspective view showing a laminator known in the used with the present invention.

Referring to the drawings wherein like reference numerals represent identical or corresponding parts throughout the several views. Referring to FIG. 1, there is shown a perspective view of laminator 10 of the present invention having an entrance table 20, exit table 30, entrance slot 40, pressure lever 50, top cover 60, right side cover 70, left side cover 80, control panel 90, and lamination base 100.

Figure 2:
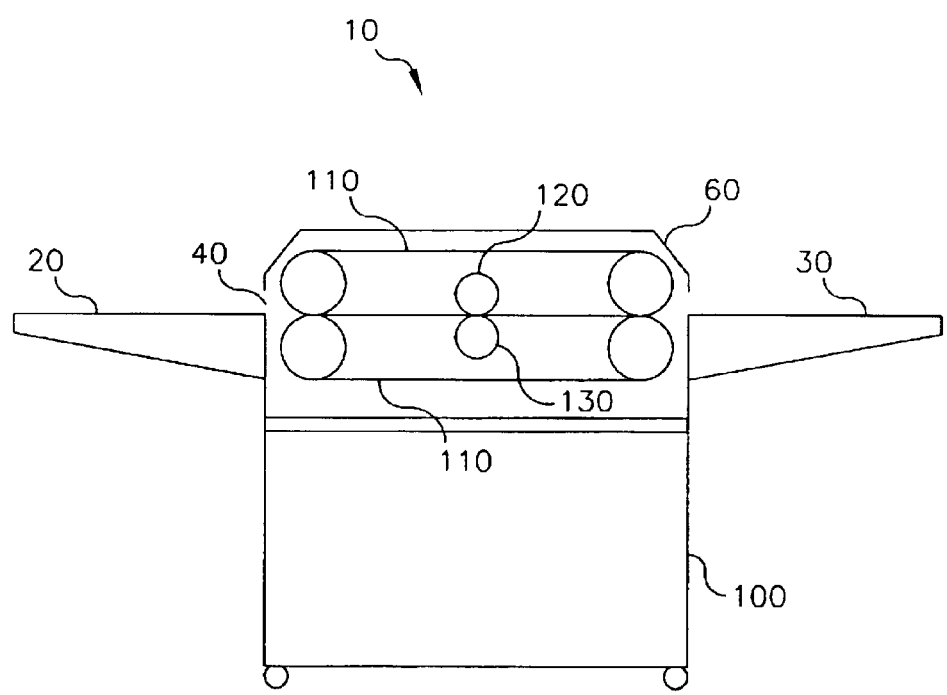
FIG. 2 is a schematic right side elevation of the laminator of FIG. 1.

FIG. 2 is a schematic right side elevation of the laminator 10 showing embossing belts 110 with an embossing mark 115 (not shown) thereon for creating an identifying mark (not shown) or thermal mark 190 (not shown) on a pre-press proof 200 (not shown) along with the upper lamination roller 120 and lower lamination roller 130 which along with said embossing belts 110 convey media to be laminated through the laminator 10. Media to be bonded or laminated passes between the embossing belts 110 and it should be noted, that only one of the belts needs to be an embossing belt 110. The embossing belt 110 and embossing mark 115 are shown in more detail in FIG. 7. Preferably the identifying mark is a thermal mark 190, a pressure mark 195, or both. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that only one of the upper lamination roller 120 and lower lamination roller 130, could be heated. It is further recognized that both upper lamination roller 120 and lower lamination roller 130 do not have to be heated for cold lamination applications.

The following methods are usable for forming a pre-press proof 200 with a resolution of between 1000 and 4000 dpi, although in the most preferred embodiment, the high resolution is between 1200 and 3600 dpi. The image can be initially created on print media 380 with an inkjet printer, laser printer, or any other printing method known in the art.

Figure 3:
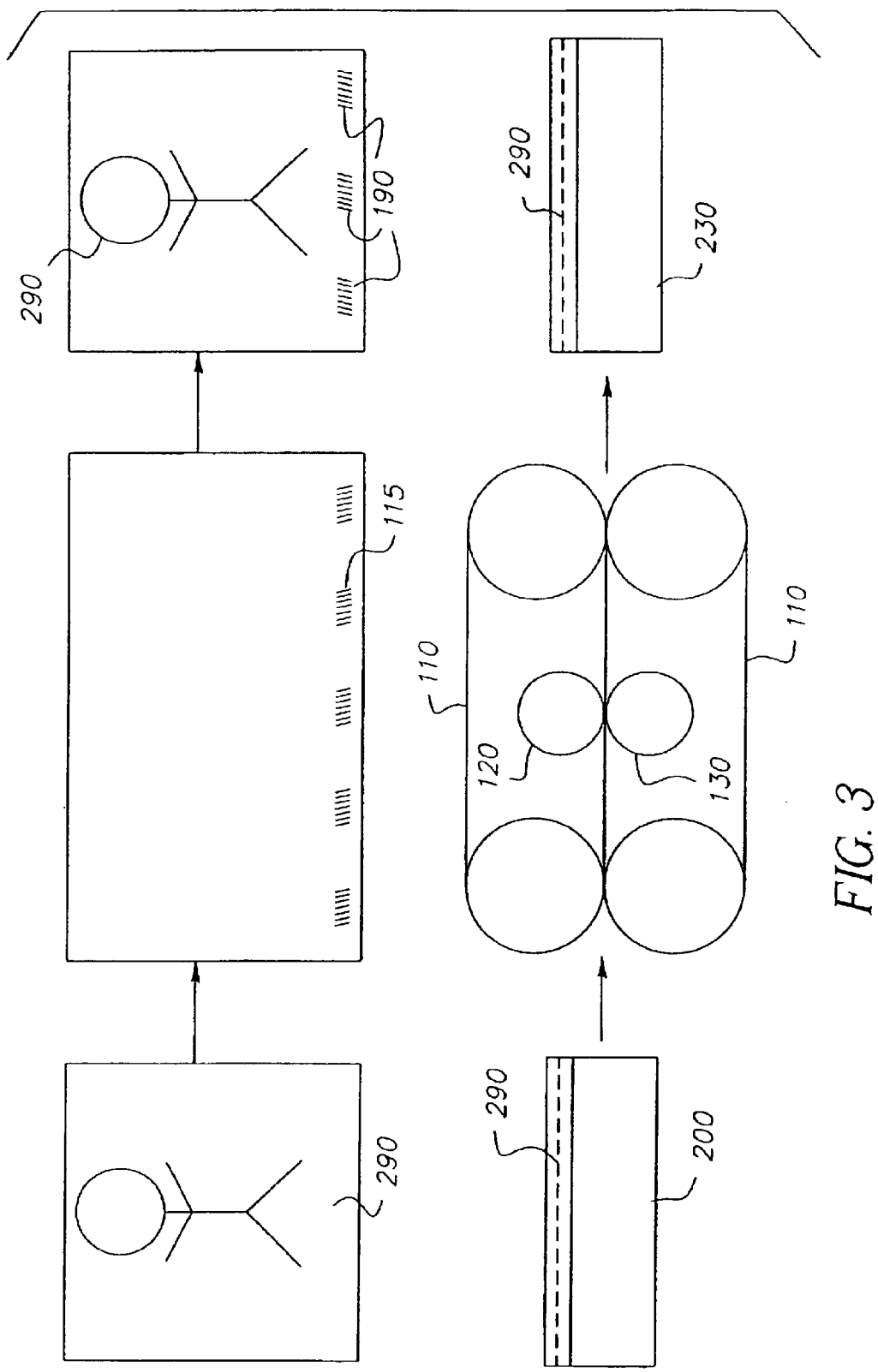
FIG. 3 is a block diagram showing one embodiment of the method for producing a pre-press proof with a thermal mark of the invention.

Referring to FIG. 3 a block diagram is shown outlining a method for producing a pre-press proof with a thermal mark 230, which comprises the steps of creating a pre-press proof 200 having an image 290 formed thereon; embossing the surface of the pre-press proof 200 by passing the pre-press proof 200 through laminator 10 with embossing belts 110 having an embossing mark 115 to form a thermal mark 190 thereon; thus forming a pre-press proof with a thermal mark 230.

Figure 4:
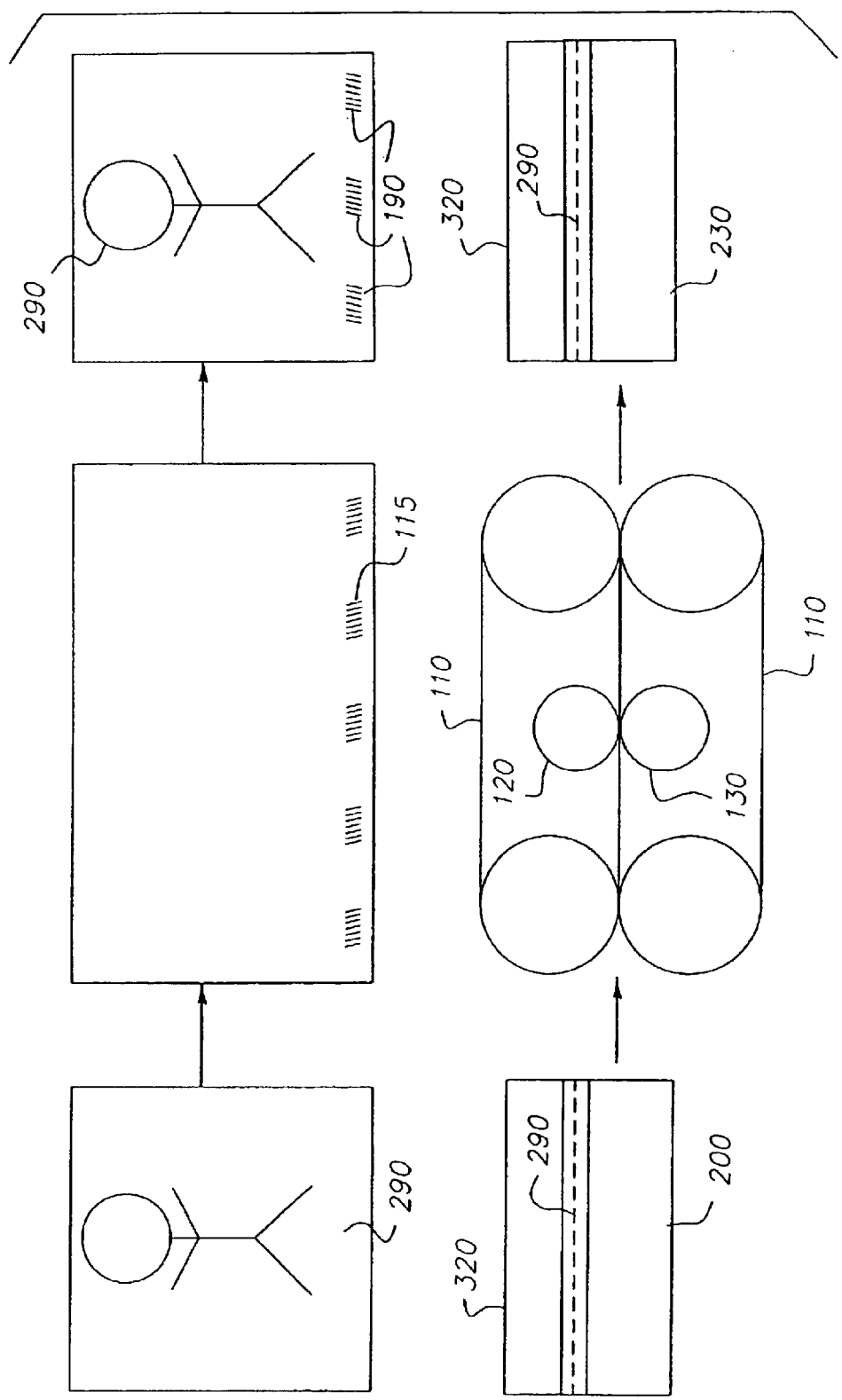
FIG. 4 is a block diagram showing another embodiment of the method for producing a pre-press proof with a thermal mark of the invention.

Referring to FIG. 4 a block diagram is shown outlining an alternative embodiment of the invention, the invention relates to a method for creating a pre-press proof with a thermal mark 230 which comprises creating a pre-press proof 200 having an image 290 formed thereon; overlaying and laminating the pre-press proof 200 with a plastic cover sheet 320 embossing the surface of the plastic cover sheet 320 with an embossing belt 115 having at least one embossing mark 115 to form a thermal mark 190 thereon; and forming an overlaid pre-press proof with a thermal mark 330.

Figure 5:
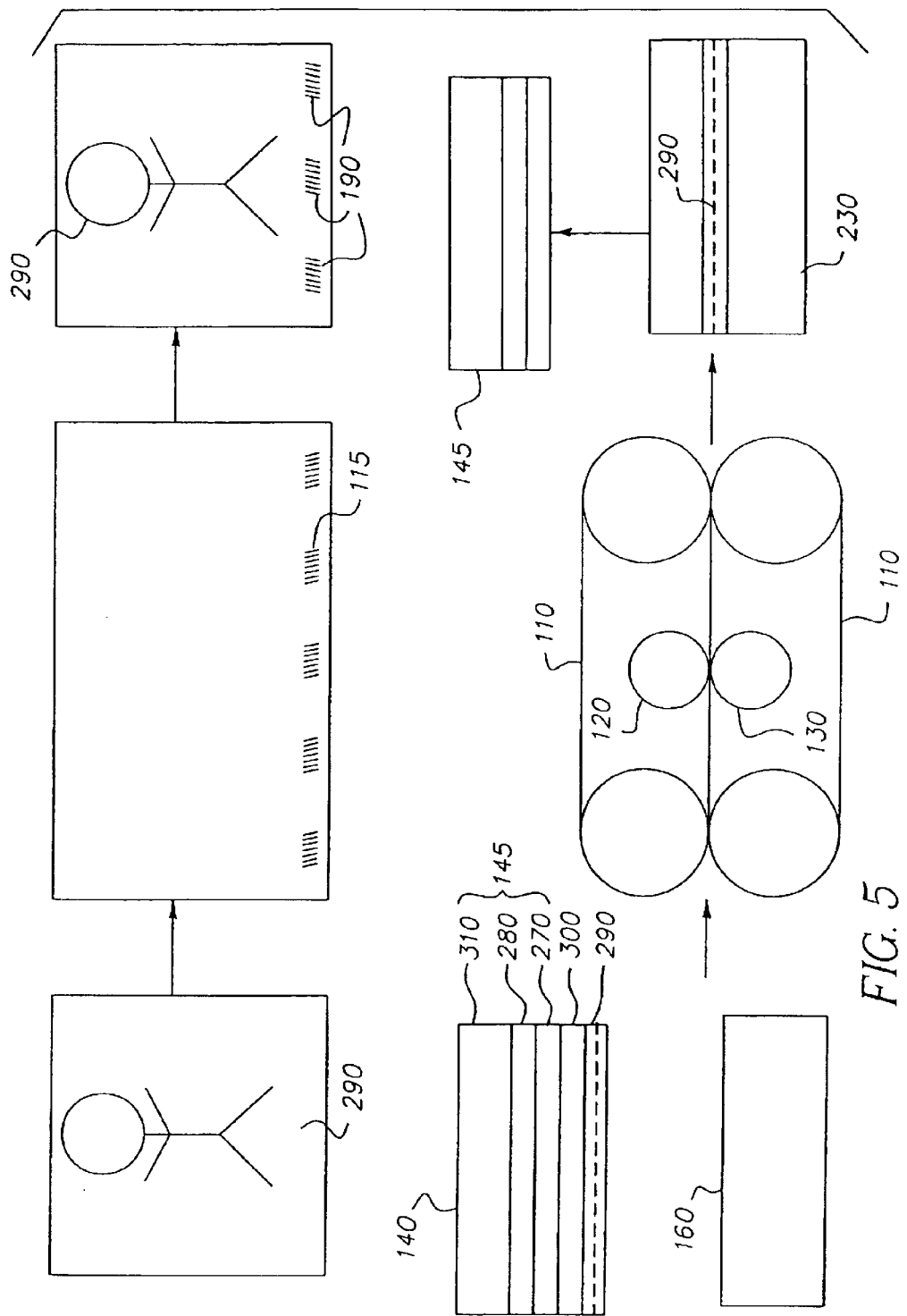
FIG. 5 is a block diagram showing another embodiment of the method for producing a pre-press proof with a thermal mark of the invention.

Referring to FIG. 5 a block diagram is shown outlining another alternative embodiment of the invention, which relates to a method for creating a pre-press proof with a thermal mark 230 which comprises creating an imaged receiver sheet 140 having a support layer 145 comprising a release layer 270, aluminized layer 280 and a support base 310 combinations there of or just a support base 310, and a print layer 300 having an image 290 formed on print layer 300; laminating the imaged receiver sheet 140 to a sheet of receiver stock 160; with laminator 10 having at least one embossing belt 115 having at least one embossing mark 115 to form a thermal mark 190 thereon removing the support layer 145; and forming a pre-press proof with a thermal mark 230.

Figure 6A:
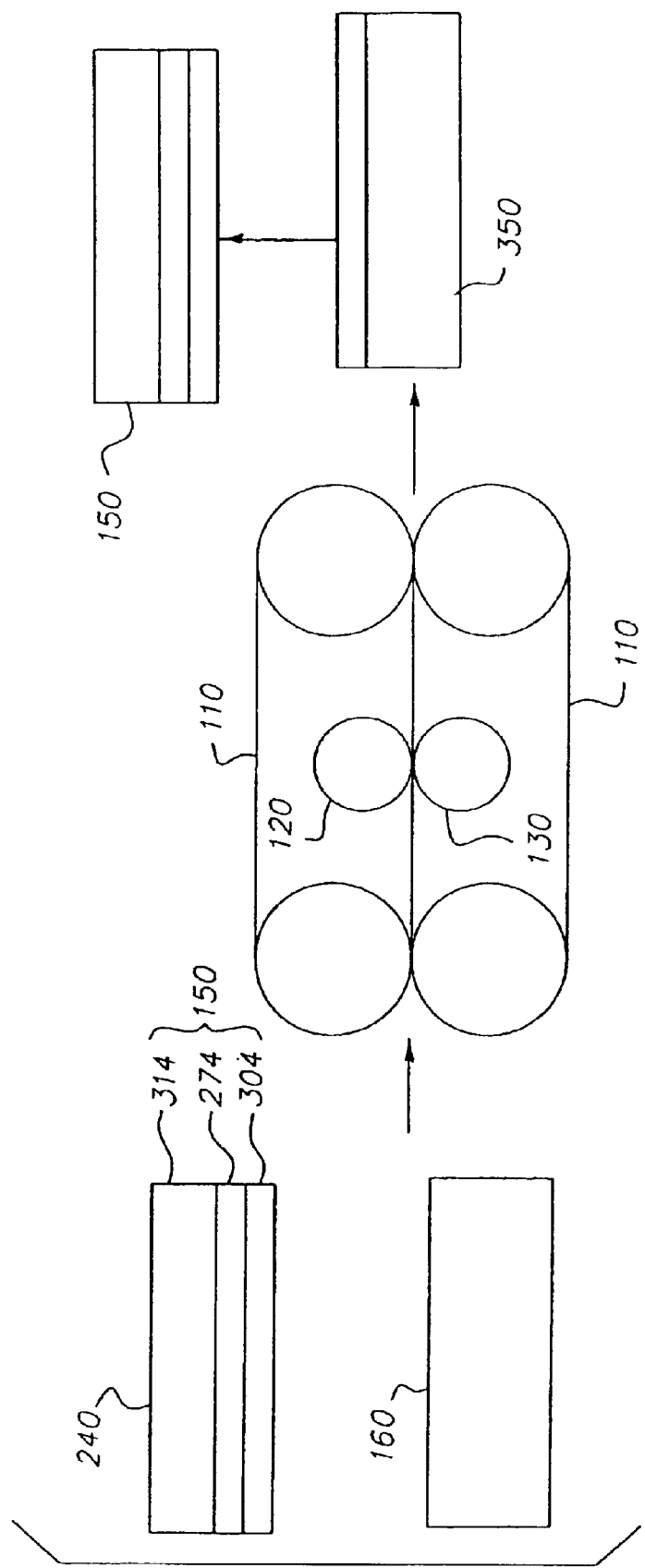
FIG. 6 is a block diagram showing another embodiment of the method for producing a pre-press proof with a thermal mark of the invention.
Figure 6B:
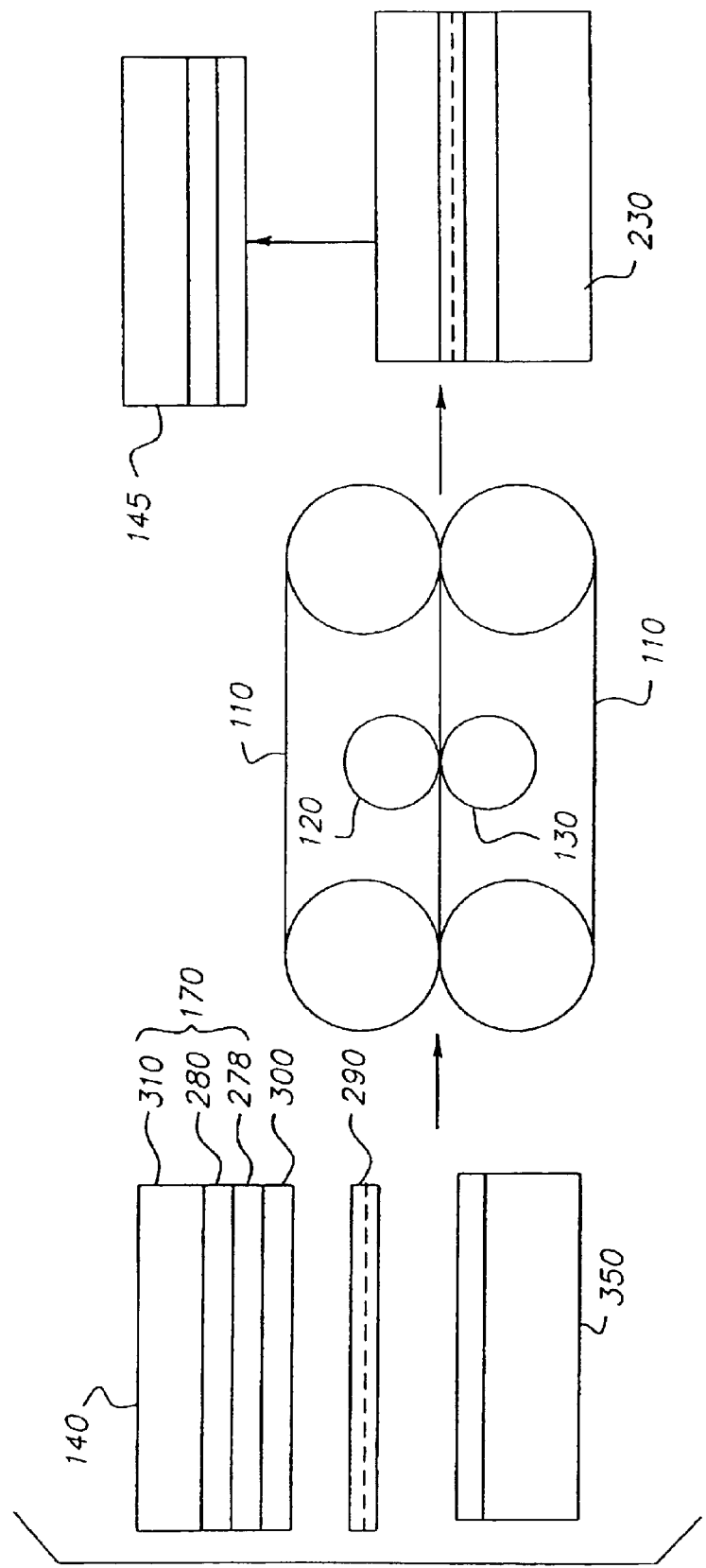

Referring to FIG. 6 a block diagram is shown outlining another alternative embodiment of the invention, the invention relates to a method for creating a pre-press proof with a thermal mark 230 which comprises the steps of: laminating a pre-laminate sheet 240 consisting of a first print layer 304, and a first support layer 150 having a first release layer 274 and a first support base 314 or just a first support base 314, to a receiver stock 160; removing the first support layer 150 forming a pre-laminated receiver stock 350; creating an imaged receiver sheet 140 having a second support layer 170 comprising second release layer 278, aluminized layer 280 and a second support base 318 combinations there of or just a second support base 318; laminating the imaged receiver sheet 140 to the pre-laminated receiver stock 350; by laminating with an embossing belt 115 having at least one embossing mark 115 to form a thermal mark 190 thereon; and removing the second support 170 layer forming a pre-press proof with a thermal mark 230.

The invention contemplates the formation of a pre-press proof with a thermal mark 230 with an image resolution of between 1000 and 4000 dpi using the methods described above, although the more preferred resolution is expected to be between 1200 and 3600 dpi.

Additionally, it is contemplated that the image 290 formed on imaged receiver sheet 140 can be either monochrome or a multi-colored, that the image 290 of the imaged receiver sheet 140 can be an inkjet generated imaged, that the print layer 300, first print layer 304, and second print layer have a thickness between 1 and 75 microns, and that the glossing sheet can be made from a sheet of plastic or from a recycled support layer.

It is further contemplated that a pre-press proof with a thermal mark 230 could be formed on both side of a receiver stock 160 simultaneously or one side at a time.

The invention also relates to a laminator 10 for forming a pre-press proof 200 having an identifying mark 190 or thermal mark comprising an upper lamination roller located on a first side of a media passage; a lower lamination roller located on a second side of the media passage so as to oppose the upper roller, wherein a nip portion is defined between the upper lamination and lower lamination rollers so as to apply pressure to media in the media passage which passes through the nip portion; wherein at least one of the upper lamination and lower lamination rollers is a solid roller; at least one embossing belt 110; and wherein the embossing belt 110 creates an identifying mark on a pre press proof upon passing of the pre-press proof through the laminator 10.

In an alternative embodiment, the laminator 10 is contemplated to have at least one roller containing a heater element.

In still another embodiment, it is preferable that at least one embossing belt 110 comprises a polyamide, such as nylon 6, 6, or nylon 6, 10, or combinations of these materials. It is contemplated that two embossing belts 110 could be used within the scope of this invention.

Finally, it is contemplated to be within the scope of this embodiment of the invention, that the embossing belt 110 can be made from either a polyamide, a fluropolymer, a polyisocyanate, a polyphenylene sulfide, a polycarbonate, a copolymer of any of the foregoing, or combinations of these materials.

FIG. 8 is a perspective view of the embossing belt 110 according to the invention. It is contemplated that the embossing belt 110 has at least one embossing mark 115, which can be at least one figure or design or possibly a number, or a series of numbers, or a character or series of characters and combinations thereof disposed on the surface of the embossing belt 110. A question mark would be an example of such a design or character to be disposed on the embossing belt 110. Exclamation marks "!" would be another example.

The invention has been described in detail with particular reference to certain preferred embodiments thereof, but it will be understood that variations and modifications can be effected within the scope of the invention.

PARTS LIST

10. Laminator
20. Entrance table
30. Exit table
40. Entrance slot
50. Pressure lever
60. Top cover
70. Right side cover
80. Left side cover
90. Control panel
100. Lamination base
110. Embossing belt
115. Embossing mark 120. Upper lamination roller
130. Lower lamination roller
140. Imaged receiver sheet
145. Support layer
150. First support layer
160. Receiver stock
170. Second support layer
190. Thermal mark
195. Pressure mark
200. Pre-press proof
230. Pre-press proof with a thermal mark
240. Pre-laminate sheet
270. Release layer
274. First release layer
278. Second release layer
280. Aluminized layer
290. Image
300. Print layer
304. First print layer
310. Support base
314. First support base
320. Plastic cover sheet
350. Pre-laminated receiver stock

What is claimed is:

1. A method for creating a pre-press proof with a thermal mark consisting of:

creating a pre-press proof having an image formed thereon; and embossing the surface of said pre-press proof while laminating said pre-press proof with an endless embossing belt having an embossing mark to form a thermal mark thereon wherein the image has a resolution of between 1000 dpi and 4000 dpi.

2. A pre-press proof with a thermal mark with a resolution of between 1200 dpi and 3600 dpi formed by the method of claim 1.

3. The method of claim 1 wherein said pre-press proof comprises a monochrome image.

4. The method of claim 1 wherein said pre-press proof comprises a multi-colored image.

5. The method of claim 1 where in the image is an inkjet generated image.

6. The method of claim 1 wherein said pre-press proof is a dual sided pre-press proof.

* * * * *

UNITED STATES PATENT AND TRADEMARK OFFICE
CERTIFICATE OF CORRECTION

PATENT NO. : 6,811,641 B2 Page 1 of 1
APPLICATION NO. : 10/020772
DATED : November 2, 2004
INVENTOR(S) : Roger S. Kerr et al.

It is certified that error appears in the above-identified patent and that said Letters Patent is hereby corrected as shown below:

Title Page, Item [*]   Insert: --This Patent is subject to a Terminal Disclaimer--

Signed and Sealed this

Twelfth Day of August, 2008

JON W. DUDAS
*Director of the United States Patent and Trademark Office*